United States Patent [19]
White et al.

[11] Patent Number: 5,867,018
[45] Date of Patent: Feb. 2, 1999

[54] HIGH ACCURACY FOUR-TERMINAL STANDARD RESISTOR FOR USE IN ELECTRICAL METROLOGY

[75] Inventors: David Rodney White; Keith Jones, both of Lower Hutt, New Zealand

[73] Assignee: Industrial Research Limited, Lower Hutt, New Zealand

[21] Appl. No.: 702,587

[22] PCT Filed: Mar. 2, 1995

[86] PCT No.: PCT/NZ95/00022

§ 371 Date: Nov. 18, 1996

§ 102(e) Date: Nov. 18, 1996

[87] PCT Pub. No.: WO95/23979

PCT Pub. Date: Sep. 8, 1995

[30] Foreign Application Priority Data

Mar. 2, 1994 [NZ] New Zealand ............................ 260012
Dec. 2, 1994 [NZ] New Zealand ............................ 270054

[51] Int. Cl.$^6$ ..................................................... G05F 3/08
[52] U.S. Cl. ............................................................ 323/354
[58] Field of Search .................................. 323/233, 297, 323/354

[56] References Cited

U.S. PATENT DOCUMENTS

| | | | |
|---|---|---|---|
| 3,252,091 | 5/1966 | Morgan | 324/126 |
| 3,273,143 | 9/1966 | Wasserman | 323/354 |
| 3,559,144 | 1/1971 | Isaacs | 323/354 |
| 3,590,366 | 6/1971 | Vaughn | 323/354 |
| 3,898,593 | 8/1975 | Qureshi | 323/354 |
| 4,138,637 | 2/1979 | Weinert | 323/354 |
| 4,354,159 | 10/1982 | Schorr et al. | 323/354 |
| 4,468,607 | 8/1984 | Tanaka et al. | 323/354 |
| 4,849,903 | 7/1989 | Fletcher et al. | 364/482 |
| 5,339,021 | 8/1994 | Thomson | 323/354 |
| 5,363,070 | 11/1994 | Arimoto | 323/354 |
| 5,408,205 | 4/1995 | Blacka | 323/354 |

FOREIGN PATENT DOCUMENTS

| | | | |
|---|---|---|---|
| 6036901 | 2/1994 | Japan | H01C 17/06 |
| 658955 | 3/1994 | Japan | G01R 1/73 |
| 1190320 | 11/1985 | U.S.S.R. | G01R 35/00 |
| 1601588 | 10/1990 | U.S.S.R. | G01R 17/20 |
| 1769151 | 10/1992 | U.S.S.R. | G01R 27/20 |

OTHER PUBLICATIONS

B.V. Hamon, "A 1–100 ohm Build–up Resistor for Calibration of Standard Resistors," Dec. 1954.
H.B. Brooks, "The Accuracy of Commercial Electrical Measurements," Dec. 1920.
F. Wenner and E. Weibel, "Adjustments of the Thomson Bridge in the Measurement of Very Low Resistances," May 1915.
B.P. Kibble and G.H. Raynor, "Coaxial AC Bridges," Dec. 1984. p. Cover, Table of Contents, Preface, 18–25, 44–49, 132–141.
J.C. Riley, "The Accuracy of Series and Parallel Conections of Four–Terminal Resistors," Sep. 1967.
C.H. Page, "Errors in Series–Parallel Buildup of Four–Terminal Resistors," Jul./Sep., 1965.
I. Gorini, "Errors in the Parallel Connection of a 100:1 Series–Parallel Guild–up of Fourior–Terminal Resistors," Aug. 1972.
A.M. Thompson, "Self–Checking Resistive Ratios," Dec. 1978.

Primary Examiner—Jeffrey Sterrett
Attorney, Agent, or Firm—Dorsey & Whitney LLP

[57] ABSTRACT

A four-terminal resistance network provides a range of four-terminal resistance values. The network comprises multiple resistances of at least two different resistance values and typically four or more resistances in a star, ring, or ladder configuration. A combining network connects the resistances in different series, parallel and series-parallel configurations to give the range of four-terminal resistance values. Typically in some of said configurations all of the resistances are used and in others only some of the resistances are used. Typically the number of four-terminal resistance values is greater than the number of resistances.

18 Claims, 8 Drawing Sheets

HIGH ACCURACY FOUR-TERMINAL STANDARD RESISTOR FOR USE IN ELECTRICAL METROLOGY

RELATED APPLICATIONS

This application claims the priority of New Zealand Patent Application No. 260012, filed Mar. 2, 1994; New Zealand Patent Application No. 270054, filed Dec. 2, 1994 and International Patent Application No. PCT/NZ95/00022, filed Mar. 2, 1995, which are incorporated herein by reference.

FIELD OF THE INVENTION

This invention comprises resistance network which provides a range of accurate resistance values, as may be used for the evaluation of the accuracy and/or linearity of electrical resistance measuring instruments.

BACKGROUND

Resistance networks exhibiting useful properties are used in many aspects of electrical metrology for: the realisation of electrical measurement standards; the evaluation of those standards; and the evaluation of electrical measuring equipment. One such family of networks in common use is the 4-terminal series-parallel build-up resistors known as Hamon resistors. The basic design of the Hamon resistor was proposed by Hamon in 1954—see B V Hamon, "A 1–100 ohm build-up resistor for calibration of standard resistors", *J Sci Instru*, vol 31, pp 450–453, December 1954. Three of the four key principles that Hamon brought together in his resistor network were known for some time. The principles exploited by Hamon resistor are:

The Four-Terminal Resistor: Electrical resistances drawn in most engineering texts have two terminals. In such a resistor it is impossible to electrically discriminate between the resistor itself and the resistance in the two lead wires connected to it. This severely limits the attainable accuracy in many applications. For high accuracy work four-terminal resistors are used. These resistors have two terminals through which the current is passed, and two terminals where the voltage is measured. The ratio of the voltage to current, the resistance, is independent of all of the four lead resistances. This principle is probably due to Lord Kelvin.

Equal Resistors Connected in Series and Parallel to Realise Accurate Resistance Ratios: It was known that the resistance of N nominally equal value resistors in series is equal to N squared times the resistance of the N resistors in parallel. Further, if the values of the N resistors are adjusted to equality within a given tolerance then the accuracy of the ratio of the series to parallel resistances is accurate to the square of the tolerance. For example, 10 nominally equal 10 ohm resistors matched to within 1 part in 1000 (0.1%) may be connected in series to make a 100 ohm resistance, or in parallel to make a 1 ohm resistance. It can be shown that the ratio of the two resistances so made is accurate to 1 part in 1 000 000 (0.00001%). This principle is probably due to Lord Rayleigh.

The Four-Terminal Junction: Prior to the publication of Hamon's paper, Rayleigh's series-parallel principle proved difficult to exploit. For low values of resistance the effects of lead and contact resistances could not be ignored and the resulting errors limited the accuracy of the measurements. Hamon discovered a way to realise and exploit a four-terminal resistor so that when a current is passed through any pair of leads there is zero voltage produced across the other two leads. Hamon discovered that a four-terminal junction can be realised simply by ensuring that three of the four leads to a junction block are symmetrical with respect to the fourth. Several successful geometries for the manufacture of the junction are known. U.S. Pat. No. 3,252,091 discloses one such geometry.

A four-terminal junction can be used to connect each of the (say, 10) resistors permanently in series in such a way that: firstly, each resistor is a well-defined four-terminal resistance; secondly, the resistance of the (say, 10) in series is exactly equal to the sum (of the 10) because the variable effects of the contact resistances are eliminated; and thirdly, with the use of a combining network as outlined below, it is possible to connect the (10) resistors in a parallel network such that the effects of the lead resistances is negligible.

Combining Networks: In order to make the parallel connection of the Hamon resistor, a low (but practically not zero) resistance connection must be made to each of the terminals of the (10) resistors. Because the resistance of the connection is not zero, the currents through each of the resistors may not be equal. If the currents are not equal then the measured value for the parallel resistance will be in error. The solution is to deliberately introduce known resistances in the various leads so that the current is shared equally. Because the four-terminal resistance is defined independently of the lead resistances, the combining network (also known as a compensation or sharing network) does not directly introduce any error. In practice, a combining network can be introduced into the current terminals or the voltage terminals with equal effect or in both for a greater effect. The sharing network principle was used by Kelvin in his double bridge—see U.S. Pat. No. 3,252,091, and was described in relation to the parallel connection of resistors by Brooks—see H B Brooks, *Trans Amer Inst Elect Engrs*, 39, p 549, 1920, and Wenner—see F Wenner and E Weibel, *Bull Nat Bur Stand*, 11, p 65, 1914, and is described by Kibble and Rayner—see B P Kibble and G H Rayner, "Coaxial AC Bridges", (Adam Hilger, Bristol) 1984 in more general terms.

The series-parallel build-up resistor (or Hamon resistor) described has been an important element of electrical metrology since Hamon described the idea. Many variants have been built and described with different numbers of resistors and simultaneous use of series and parallel combinations. The papers by Riley—see J C Riley, "The Accuracy of Series and Parallel Connections of Four-Terminal Resistors", *IEEE Trans Instrum Meas*, vol IM-16, pp 258–68, September 1967, Page—see C H Page, "Errors in the series-parallel build up of four-terminal resistors", *J Res Nat Bur Stand Sect C*, vol 69, pp 181–9, July/September 1965, Gorini—see I Gorini, "Errors in the Parallel Connection of a 100:1 Series-Parallel Build-up of Fourier-terminal Resistors", *IEEE Trans Instrum Meas*, vol IM-21, No. 3, August 1972, as well as Hamon describe the possible errors and their minimisation in the realisation of the Hamon resistors.

Commercially manufactured versions of the Hamon resistors are known to be produced by a number of companies including: Leeds and Northrup (Australia), who have followed Hamon's design in some detail; Guildline Instruments (Canada); and Electro Scientific Industries (USA).

The main use for Hamon resistors has been for the establishment of DC resistance standards at decade intervals, e.g. 1, 10, 100, 1000, 10000 ohms, etc. Measurements of the resistor for, say, the 1 ohm combination means that the value of the combination at the other values is also known. The main attribute of the resistors is the very high accuracy with which the resistance ratios can be realised (as good as 1 part in 100 000 000). Hamon resistors have also been used in pairs to establish accurate voltage ratios. Thompson—see A M Thompson, "Self checking Resistive Ratios", *IEEE Trans Instr Meas*, IM-27, 4, pp 423–5, December 1978, describes their application in general to the realisation of accurate voltage dividers. As with build-up resistors, the matching of equal valued resistors is critical to the performance of Hamon style voltage dividers.

All the Hamon networks have a large redundancy in the resistances realised i.e. some of the nominal resistance values can be realised by more than one series-parallel combination of the component resistors. Another disadvantage of Hamon networks, whether for build-up resistors or voltage dividers is that they are made with nominally equal valued resistances to exploit the Rayleigh principle, that is, to establish accurate ratios of resistance. Hamon networks are also made with the resistors connected permanently in series (in the so-called "ladder" form) so that two of the terminals of each of the four terminal junctions are used only as voltage or current terminals.

SUMMARY OF THE INVENTION

The invention provides an improved or at least alternative form of resistance network which overcomes or at least reduces some of the above stated disadvantages in the Hamon network in particular.

In broad terms the invention comprises a four-terminal resistance network providing a range of four-terminal resistance values, comprising multiple resistances of at least two different resistance values, and a combining network comprising switching means switchable to connect the resistances in different series, parallel and series-parallel configurations giving a range of four terminal resistance values across the network.

Networks of the invention comprise at least two deliberately unequal resistors. Networks of the invention may be connected as a star, a ring, or a ladder for example or combination thereof, or in other desired configurations, according to the number and range of resistances required to be realised by the network. Networks can be arranged and resistance values chosen to realise a large number of resistances relative to the number of component resistors of the network. In networks of the invention it is possible for there to be little or no redundancy in the resistances realised by the network.

The utility and accuracy of networks of the invention is not critically dependent on the degree to which the resistors are equal to their nominal values or each other. Their performance does depend on the match of the combining networks.

DESCRIPTION OF THE DRAWINGS

The invention will be further described with reference to the accompanying drawings, wherein:

FIG. 1(*a*) shows a two-terminal resistor and FIG. 1(*b*) shows a four-terminal resistor;

FIG. 2(*a*) shows the equivalent circuit for a four-terminal junction and FIGS. 2(*a*) to (*f*) show various practical realizations of a four terminal junction;

FIGS. 9(*a*) to 9(*f*) show the various combining network connections required to realise various resistance values for the four resistor star network of FIG. 5;

DESCRIPTION OF FIGS. 1–4—PRIOR ART

Figure 1A:
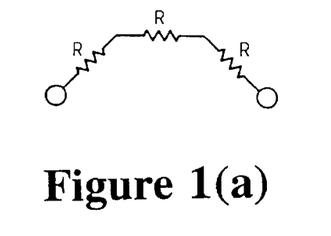
Figure 1B:
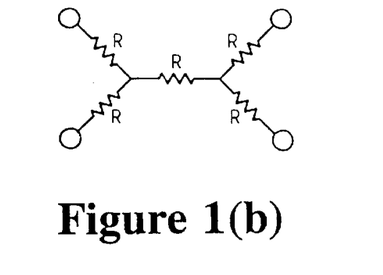
Figure 2A:
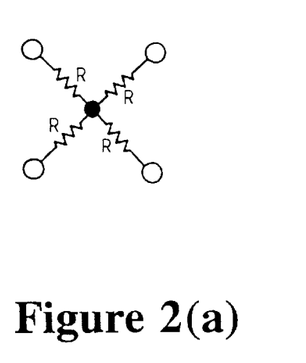
Figure 2B:
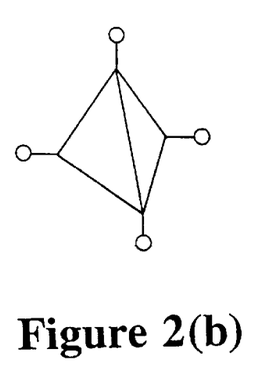
Figure 2C:
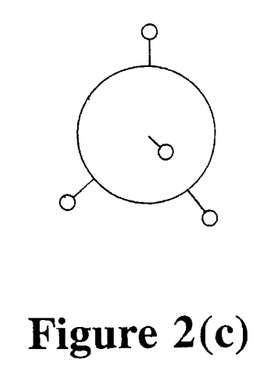
Figure 2D:
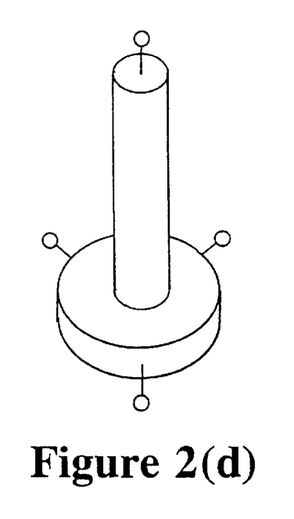
Figure 2E:
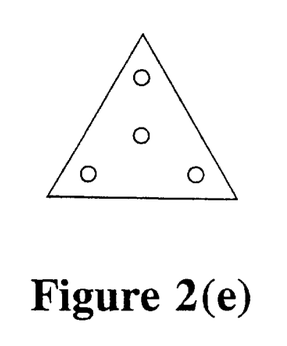
Figure 2F:
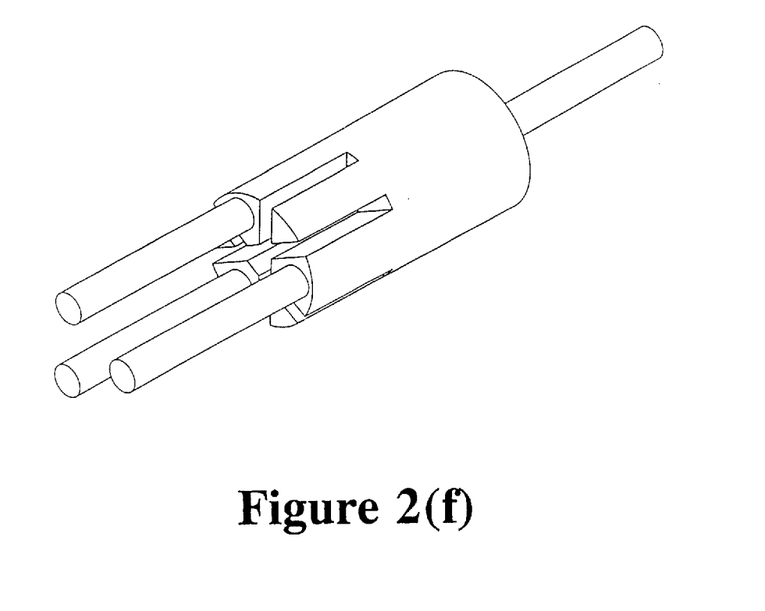

FIG. 1(*a*) shows a two-terminal resistor. FIG. 1(*b*) shows a four-terminal resistor, the lead resistances r are also being shown. FIG. 2(*a*) shows the equivalent circuit for a four terminal junction, and FIGS. 2(*b*) to (*e*) show various practical realisations of the junction. FIG. 2(*b*) shows a tetrahedral arrangement, FIG. 2(*c*) a spherical arrangement, FIG. 2(*d*) a radial cylindrical arrangement, FIG. 2(*e*) a triangular arrangement, and FIG. 2(*f*) an axial cylindrical arrangement. The geometry of FIG. 2(*e*) is believed to be the subject of U.S. Pat. No. 3,252,091.

Figure 3:
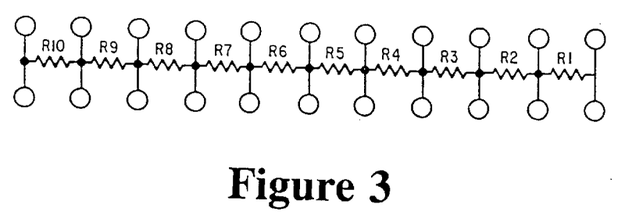
FIG. 3 shows a ten resistor Hamon network with a combining network not shown.
Figure 4:
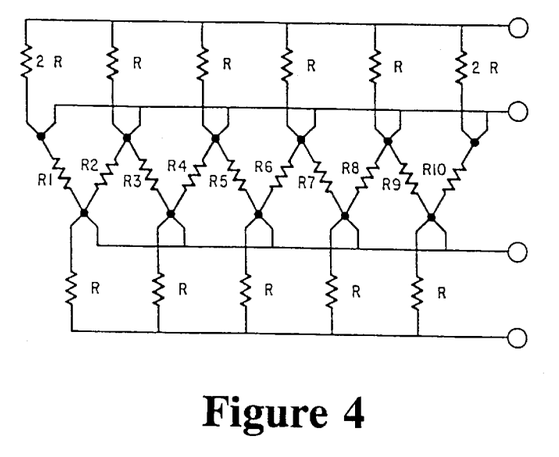
FIG. 4 shows a ten resistor Hamon resistor connected in parallel with a combining network shown.

FIG. 3 shows the equivalent circuit for a ten-resistor Hamon resistor, without a combining network, and FIG. 4 shows a complete ten resistor Hamon resistor with a combining network in the voltage leads and connected with the ten resistors in parallel. In the Hamon network, resistors of equal value are all connected permanently in series in a ladder form, so that two terminals of each of the four-terminal junctions are used only as voltage terminals and two terminals only as current terminals.

DESCRIPTION OF PREFERRED FORMS OF INVENTION

Figure 5:
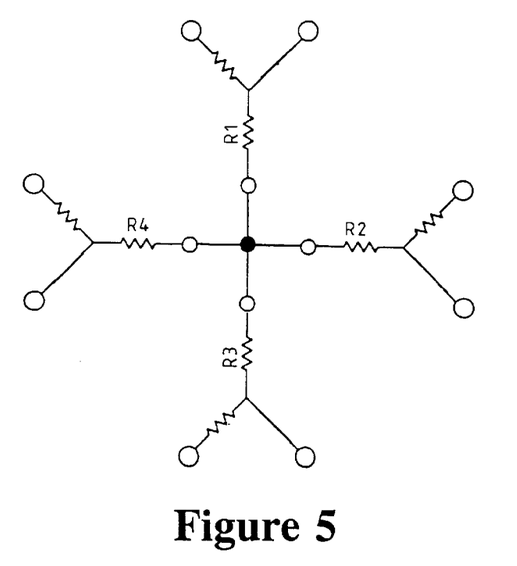
FIG. 5 shows a four resistor star network of the invention, with a combining network (excluding switching) shown.

FIG. 5 shows one preferred form network of the invention which is a four resistor star network, also showing the combining network. In this network there are up to thirty five different four terminal resistance values available as series, parallel, and series-parallel combinations of the four resistors (36 including the four terminal zero resistance).

Figure 6:
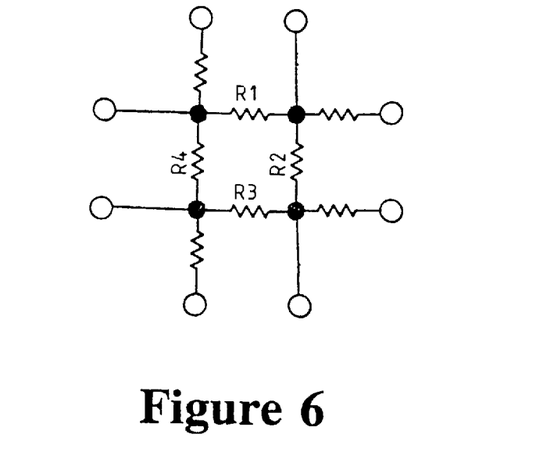
FIG. 6 shows a four resistor ring network of the invention, with a combining network (excluding switching) shown.

FIG. 6 shows another form of network of the invention, comprising a four resistor ring network.

Figure 7:
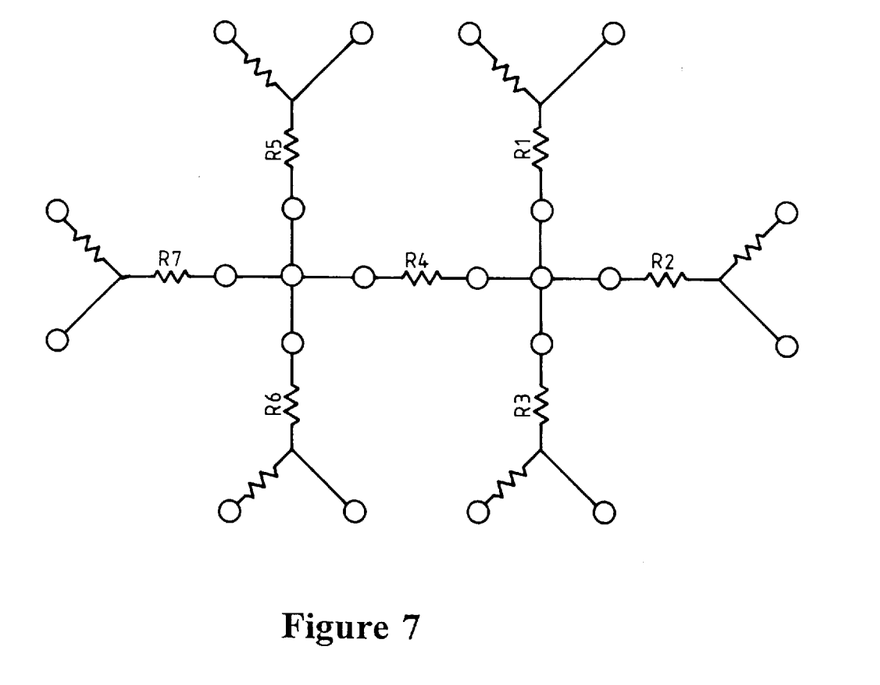
FIG. 7 shows a seven resistor star network of the invention with a combining network (excluding switching) shown.
Figure 8:
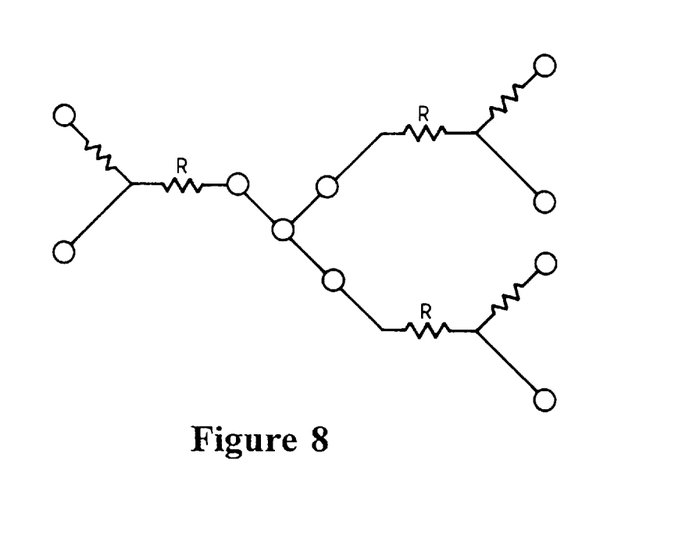
FIG. 8 shows a three resistor star network of the invention, with a combining network (excluding switching) shown.
Figure 9A:
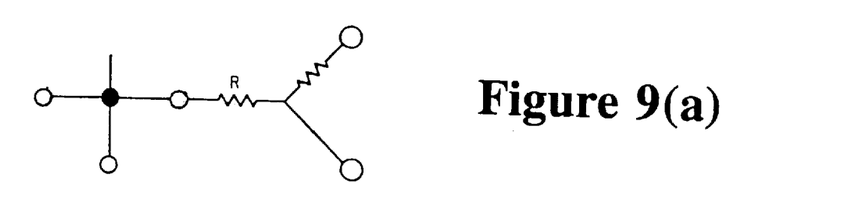
Figure 9B:
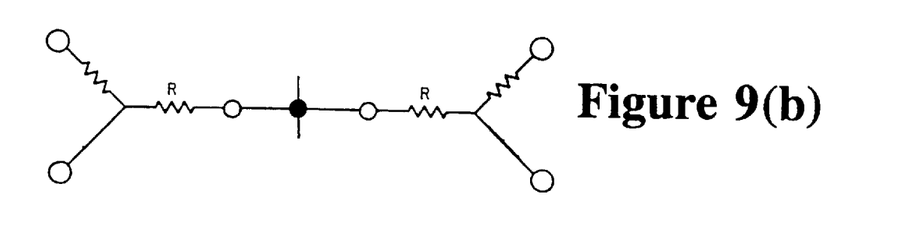
Figure 9C:
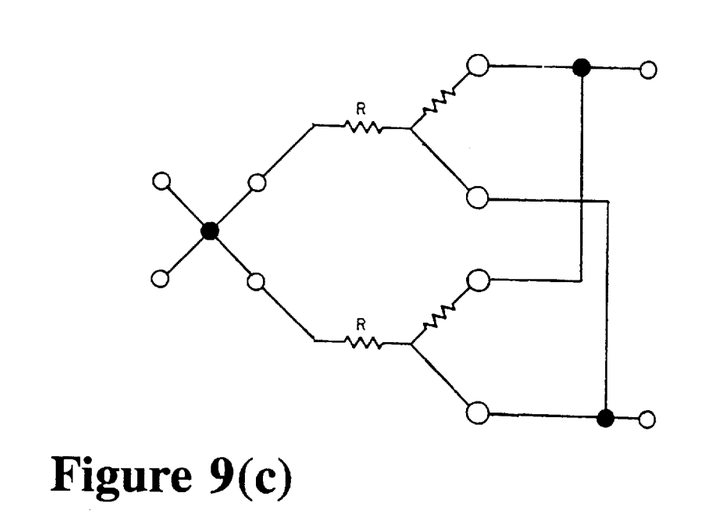
Figure 9D:
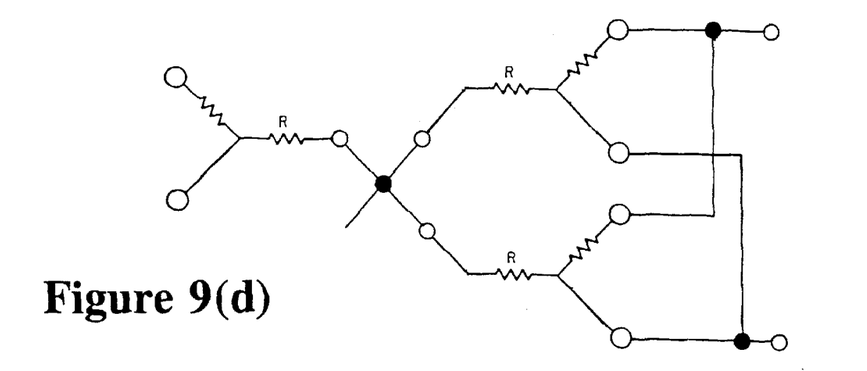
Figure 9E:
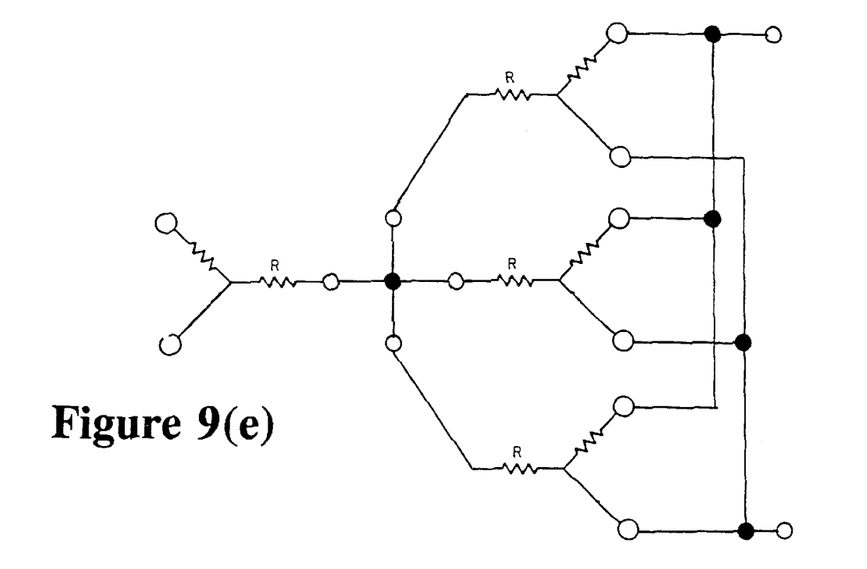
Figure 9F:
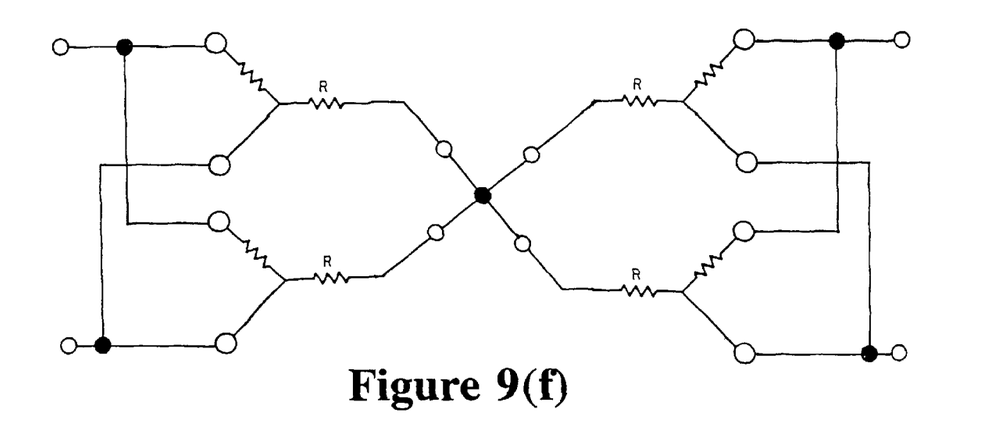

FIG. 7 shows a further preferred form network of the invention, comprising a seven resistor star network, and FIG. 8 shows a three resistor star network.

FIG. 9 shows the various combining network connections required to realise all thirty five combinations for the four resistor star network of the invention of FIG. 5. Four different values are possible from each of the four single resistors, as shown in FIG. 9(*a*). Six further values are available from six combinations of any two resistors in series, as shown in FIG. 9(*b*). Six further values are available from six different combinations of any two resistors in parallel, as shown in FIG. 9(*c*). Twelve further values are available from twelve different combinations of one resistor in series with two resistors in parallel, as shown in FIG. 9(d). Four further values are available from four different combinations of one resistor in series with three resistors in parallel, as shown in FIG. 9(e). Three further values are available from three combinations of two parallel resistors in series with two other parallel resistors, as shown in FIG. 9(f).

Figure 10:
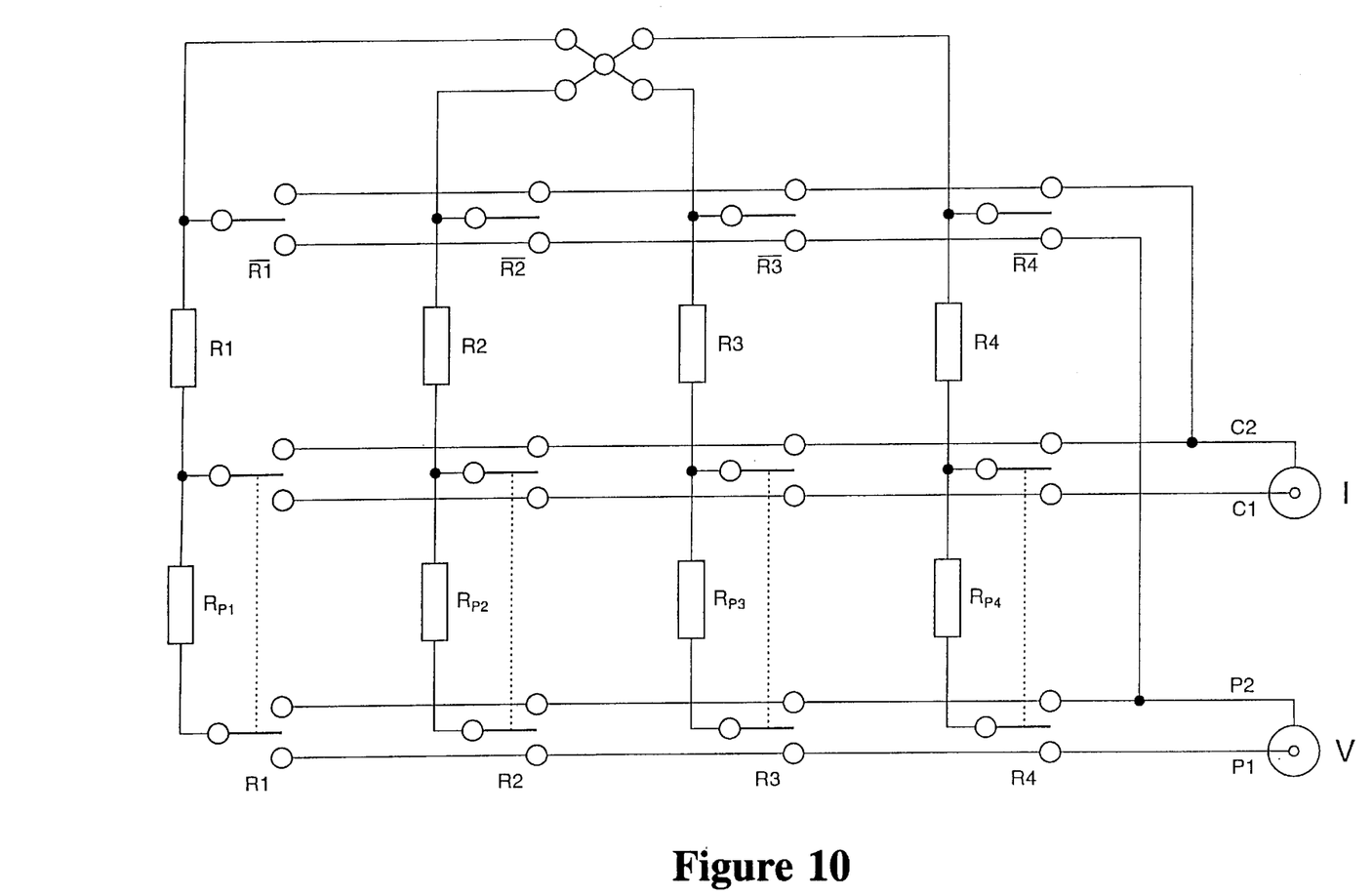
FIG. 10 is a circuit diagram of one form of a four resistor star network as in FIGS. 5 and 9, with a combining network employing 8 three-position (on-off-on) switches.

FIG. 10 is a circuit diagram of a four resistor star network as in FIG. 5 and a combining network employing eight three position (on-off-on) switches enabling all of the resistance values of the configurations of FIG. 9 to be achieved. In FIG. 10 $R_{p1}$, $R_{p2}$, $R_{p3}$ and $R_{p4}$ are the four lead resistances forming the combining network in the potential leads. Lead resistances will generally be used as is known in the art but may not be essential in low accuracy applications. The switches labelled R1 to R4 connect the current and voltage terminals of the respective resistor while the switches labelled $\overline{R1}$ to $\overline{R4}$ connect the terminals of the four-terminal junction when required. The overscore () is the symbol for logical negation (not) and indicates that the switch should not be used when the corresponding resistor is connected. The I and V terminals are the coaxial connections to the network.

Table 1 shows 35 combinations possible and resistance values achieved with a four resistor star network of the invention as shown in FIGS. 5, 9 and 10 where all network resistances have different values. In this case R1=81.1 Ω, R2=47.7 Ω, R3=33.3 Ω, and R4=25.5 Ω. Column one lists the combinations in descending order of resistance; column two lists the combination where the + and // symbols indicate series and parallel respectively; column three lists the resulting resistance; and column four indicates which of the connection diagrams in FIG. 7 applies.

TABLE 1

| Combination number | Combination description | Resistance value (ohms) | Type of connection (FIG. 7) |
|---|---|---|---|
| 1 | R1 + R2 | 128.800 00 | (b) |
| 2 | R1 + R3 | 114.400 00 | (b) |
| 3 | R1 + R4 | 106.600 00 | (b) |
| 4 | R1 + R2//R3 | 100.710 00 | (d) |
| 5 | R1 + R2//R4 | 97.716 80 | (d) |
| 6 | R1 + R3//R4 | 95.541 33 | (d) |
| 7 | R1 + R2//R3//R4 | 92.185 24 | (e) |
| 8 | R1 | 81.100 00 | (a) |
| 9 | R2 + R3 | 81.000 00 | (b) |
| 10 | R2 + R4 | 73.200 00 | (b) |
| 11 | R2 + R1//R3 | 71.306 91 | (d) |
| 12 | R2 + R1//R4 | 67.100 09 | (d) |
| 13 | R3 + R1//R2 | 63.334 70 | (d) |
| 14 | R2 + R2//R4 | 62.141 33 | (d) |
| 15 | R2 + R1//R3//R4 | 59.958 48 | (e) |
| 16 | R3 + R4 | 58.800 00 | (b) |
| 17 | R4 + R1//R2 | 55.534 70 | (d) |
| 18 | R3 + R1//R4 | 52.700 09 | (d) |
| 19 | R3 + R2//R4 | 49.916 80 | (d) |
| 20 | R4 + R1//R3 | 49.106 91 | (d) |
| 21 | R2 | 47.700 00 | (a) |
| 22 | R3 + R1//R2//R4 | 47.094 11 | (e) |
| 23 | R4 + R2//R3 | 45.110 00 | (d) |
| 24 | R1//R2 + R2//R4 | 44.476 03 | (f) |
| 25 | R4 + R1//R2//R3 | 41.291 59 | (e) |
| 26 | R1//R3 + R2//R4 | 40.223 71 | (f) |
| 27 | R1//R4 + R2//R3 | 39.010 09 | (f) |
| 28 | R3 | 33.300 00 | (a) |
| 29 | R1//R2 | 30.034 70 | (c) |
| 30 | R4 | 25.500 00 | (a) |
| 31 | R1//R3 | 23.606 91 | (c) |
| 32 | R2//R3 | 19.610 00 | (c) |
| 33 | R1//R4 | 19.400 09 | (c) |
| 34 | R2//R4 | 16.616 80 | (c) |
| 35 | R3//R4 | 14.441 33 | (c) |

Table 2 shows 35 combinations possible with a four resistor star network of the invention as shown in FIG. 5 where two each of the four network resistances have the same value. In this case R1=R2=100 Ω and R3=R4=100 Ω. The combinations yield 12 distinct values that are simple rational multiples of 100 ohms.

TABLE 2

| Number | Combination | Value | Ratio with respect to 100 ohms |
|---|---|---|---|
| 1 | R1 + R2 | 200.00000 | 2:1 |
| 2 | R1 + R3 | 150.00000 | 3:2 |
| 3 | R1 + R4 | 150.00000 | |
| 4 | R2 + R3 | 150.00000 | |
| 5 | R2 + R4 | 150.00000 | |
| 6 | R2 + R1//R3 | 133.33333 | 4:3 |
| 7 | R2 + R1//R4 | 133.33333 | |
| 8 | R1 + R2//R3 | 133.33333 | |
| 9 | R1 + R2//R4 | 133.33333 | |
| 10 | R1 + R3//R4 | 125.00000 | 5:4 |
| 11 | R2 + R3//R4 | 125.00000 | |
| 12 | R1 + R2//R3//R4 | 120.00000 | 6:5 |
| 13 | R2 + R1//R3//R4 | 120.00000 | |
| 14 | R1 | 100.00000 | 1:1 |
| 15 | R2 | 100.00000 | |
| 16 | R3 + R4 | 100.00000 | |
| 17 | R3 + R1//R2 | 100.00000 | |
| 18 | R4 + R1//R2 | 100.00000 | |
| 19 | R4 + R1//R3 | 83.33333 | 5:6 |
| 20 | R3 + R1//R4 | 83.33333 | |
| 21 | R4 + R2//R3 | 83.33333 | |
| 22 | R3 + R2//R4 | 83.33333 | |
| 23 | R1//R2 + R3//R4 | 75.00000 | 3:4 |
| 24 | R3 + R1//R2//R4 | 75.00000 | |
| 25 | R4 + R1//R2//R3 | 75.00000 | |
| 26 | R1//R3 + R2//R4 | 66.66667 | 2:3 |
| 27 | R1//R4 + R2//R3 | 66.66667 | |
| 28 | R3 | 50.00000 | 1:2 |
| 29 | R4 | 50.00000 | |
| 30 | R1//R2 | 50.00000 | |
| 31 | R1//R3 | 33.33333 | 1:3 |
| 32 | R1//R4 | 33.33333 | |
| 33 | R2//R3 | 33.33333 | |
| 34 | R2//R4 | 33.33333 | |
| 35 | R3//R4 | 25.00000 | 1:4 |

Table 3 shows another example of 35 combinations possible with a four resistor star network of the invention where all resistances are of different values. In this case R1=100 Ω, R2=50 Ω, R3=33⅓ and R4=25 Ω. The combinations yield 26 distinct resistance values that are rational multiples of 100 ohms.

TABLE 3

| Number | Combination | Value | Ratio with respect to 100 ohms |
|---|---|---|---|
| 1 | R1 + R2 | 150.00000 | 3:2 |
| 2 | R1 + R3 | 133.33333 | 4:3 |
| 3 | R1 + R4 | 125.00000 | 5:4 |
| 4 | R1 + R2//R3 | 120.00000 | 6:5 |
| 5 | R1 + R2//R4 | 116.66667 | 7:6 |
| 6 | R1 + R3//R4 | 114.28571 | 8:7 |
| 7 | R1 + R2//R3//R4 | 111.11111 | 10:9 |
| 8 | R1 | 100.00000 | 1:1 |
| 9 | R2 + R3 | 83.33333 | 5:6 |
| 10 | R2 + R4 | 75.00000 | 3:4 |
| 11 | R2 + R1//R3 | 75.00000 | 3:4 |
| 12 | R2 + R1//R4 | 70.00000 | 7:10 |
| 13 | R3 + R1//R2 | 66.66667 | 2:3 |
| 14 | R2 + R3//R4 | 64.28571 | 4:7 |
| 15 | R2 + R1//R3//R4 | 62.50000 | 5:8 |
| 16 | R4 + R1//R2 | 58.33333 | 7:12 |
| 17 | R3 + R4 | 58.33333 | 7:12 |
| 18 | R3 + R1//R4 | 53.33333 | 8:15 |
| 19 | R2 | 50.00000 | 1:2 |
| 20 | R4 + R1//R3 | 50.00000 | 1:2 |

TABLE 3-continued

| Number | Combination | Value | Ratio with respect to 100 ohms |
|---|---|---|---|
| 21 | R3 + R2//R4 | 50.00000 | 1:2 |
| 22 | R1//R2 + R3//R4 | 47.61905 | 10:21 |
| 23 | R3 + R1//R2//R4 | 47.61905 | 10:21 |
| 24 | R4 + R2//R3 | 45.00000 | 9:20 |
| 25 | R4 + R1//R2//R3 | 41.66667 | 5:12 |
| 26 | R1//R3 + R2//R4 | 41.66667 | 5:12 |
| 27 | R1//R4 + R2//R3 | 40.00000 | 2:5 |
| 28 | R1//R2 | 33.33333 | 1:3 |
| 29 | R3 | 33.33333 | 1:3 |
| 30 | R4 | 25.00000 | 1:4 |
| 31 | R1//R3 | 25.00000 | 1:4 |
| 32 | R1//R4 | 20.00000 | 1:5 |
| 33 | R2//R3 | 20.00000 | 1:5 |
| 34 | R2//R4 | 16.66667 | 1:6 |
| 35 | R3//R4 | 14.28571 | 1:7 |

The range of resistance values realisable with a network of the invention can be tailored for any particular application by choice of the network resistance values and combining network connections. A network suited to the calibration of resistance thermometry bridges, which operate over a narrow range, can be derived by requiring the values of the 35 combinations to be as equally spaced as practical. For example, if the least squares criterion is applied to determine the best values for the four-component resistances in a four-resistor-star network then the optimum spacing of the 35 combinations is achieved with the four resistors in the ratio $R_1=0.625\ 490\ 2\ R_{max}$, $R_2=0.374\ 509\ 8\ R_{max}$, $R_3=0.288\ 491\ 1\ R_{max}$, and $R_4=0.222\ 675\ 2\ R_{max}$, where $R_{max}$ is the resistance of the largest combination ($R_1+R_2$). The range of resistances covered by a network based on these ratios is approximately 8 to 1.

Resistance networks of the invention can also be designed to produce a set of resistances which are all simple rational multiples of each other. For example, a four resistor star network employing four resistances in the ratio 2:2:1:1 will realise 12 distinct resistance values which are rational multiples of each other (see Table 2), and four resistors in the ratio 12:6:4:3 will realise 26 distinct resistances (Table 3).

With the appropriate choice of resistor values and combining network switching the network can be made to maximise the probability that all 10 numerals (0 to 9) occur on every (denary) digit of a bridge reading. Similarly in the case of a binary, octal or other radix bridge all or nearly all numerals of each digit may be achieved. Since with most bridges each digit is functionally linked to the component dividers in the bridge the invention provides additional valuable information that helps confirm that the bridge is functioning correctly. Table 4 gives the values of four resistances that could be employed in a four resistor star network of the invention and a frequency table giving the frequency of each numeral of each digit in the 35 combinations. The four resistor values given also approximate the distribution criterion given in (l) above.

Table 4 is for a four resistor star network employing resistors with the values: R1=81.819 354, R2=48.178 636, R3=36.515 784, and R4=31.242 214. The network yields 35 combinations with 35 distinct resistances that exercise each digit of an ideal 8-digit bridge (denary), as shown in the table. The table lists the frequency of occurrence of each numeral (0 to 9) on each digit. The network is designed for a bridge with a maximum reading of 1.299 999 9.

TABLE 4

Digit exercise table

| Numeral | 1 | 2 | 3 | 4 | 5 | 6 | 7 | 8 |
|---|---|---|---|---|---|---|---|---|
| 0 | 30 | 2 | 4 | 3 | 4 | 3 | 6 | 4 |
| 1 | 5 | 4 | 4 | 4 | 4 | 4 | 4 | 4 |
| 2 | 0 | 4 | 4 | 4 | 4 | 4 | 3 | 3 |
| 3 | 0 | 3 | 3 | 3 | 3 | 2 | 3 | 3 |
| 4 | 0 | 5 | 3 | 4 | 3 | 3 | 3 | 3 |
| 5 | 0 | 5 | 3 | 3 | 3 | 4 | 3 | 4 |
| 6 | 0 | 5 | 4 | 3 | 4 | 4 | 3 | 3 |
| 7 | 0 | 3 | 3 | 4 | 3 | 4 | 3 | 4 |
| 8 | 0 | 2 | 4 | 3 | 4 | 3 | 3 |
| 9 | 0 | 2 | 3 | 3 | 4 | 3 | 4 | 4 |

Networks of the invention may also be used for alternating current measurements as well as direct current measurements. However, whereas with DC measurements the four-terminal resistance definition is sufficient to define a resistance to the highest accuracy, for AC resistances there is the additional requirement to define the electromagnetic fields around the conducting elements of a resistor. Thus coaxial definitions of AC resistances and impedances are employed (see Kibble & Raynor referred to above), and the definitions are such that series combinations of resistances cannot be realised exactly. Secondly, because resistance and conductance bridges only measure the real part (as opposed to the reactive or imaginary part) of impedances, the formulae for the series combinations (in the case of conductance bridges) and parallel combinations of resistance (in the case of resistance bridges) are approximate. Thus in AC applications, there is a progressive decline in the accuracy of the network with increasing frequency. With careful attention to the AC properties of the components and the coaxial definition of the network, accuracies of better than 1 part in 1 000 000 000 are achievable at DC, falling to 1 part in 1 000 000 at 10 kHz. Thus the utility of networks of the invention for AC applications depends on the accuracy required and the frequency of operation.

Networks of the invention can comprise either a manually switched combining network, or a combining network which is switched automatically according to software commands received via a computer interface.

Figure 11:
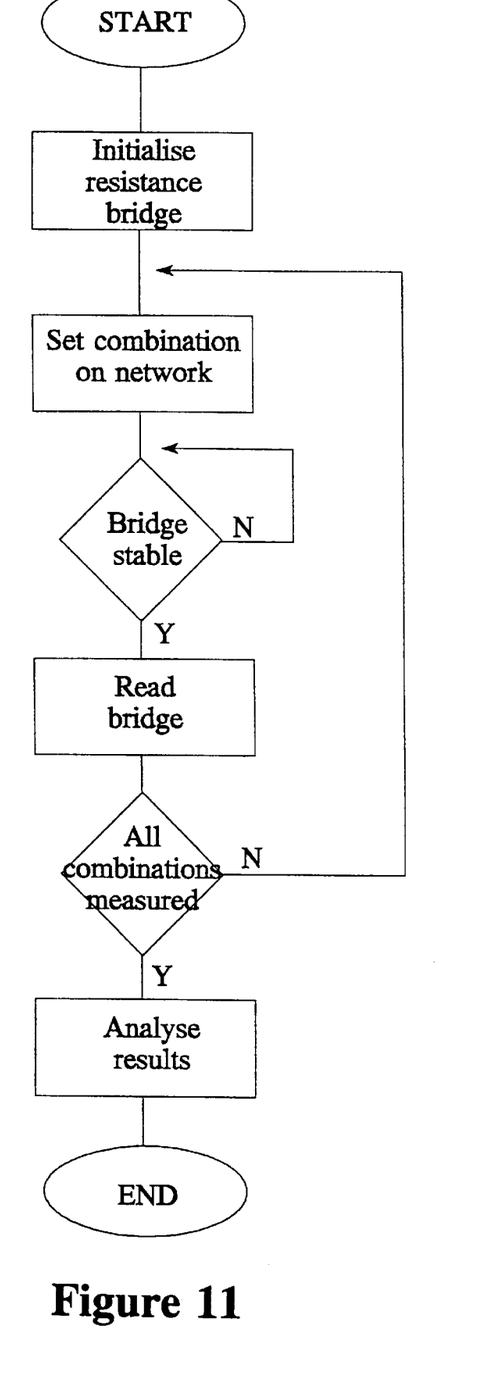
FIG. 11 is a flow chart illustrating the software flow for an automatic bridge calibration with a resistance network of the invention.

FIG. 11 shows an example of a simple flow chart illustrating the sequence of operations that might be followed when using an automated network.

EXAMPLE

A long-standing problem in electrical metrology is the calibration and verification of high accuracy AC resistance bridges. The operating frequency of the bridges is very low, typically less than 200 Hz. Prior to this invention the most reliable methods were based on AC voltage dividers (necessarily of greater accuracy than the bridge) used to individually check the voltage dividers used as components in the bridge or to simulate variable resistances—see Kibble & Raynor referred to above. This may involve disassembling the bridge to gain access to the divider components, or building a circuit of similar complexity and greater accuracy than the bridge itself both methods being very expensive. The method involving the disassembly of the bridge is also not conducive to maintain the reliability of the bridge.

Using a network of the invention, such as the four-resistor-star shown in FIG. 5, it is possible to realise 35 (or more in the case of some members of the family of networks) four-terminal resistances which are all different, cover a wide range of the capability of the bridge, and are interrelated through the usual formulae for series and parallel combinations, all at relatively low cost.

From the 35 measurements made with the bridge under test it is possible to simultaneously calculate (for example by least squares fitting) values for the four component resistors and the errors in the measurements of resistance made with the bridge. By virtue of providing the means to simultaneously establish that a bridge is functioning correctly and determine the relative values for its component resistors, the network is described as self-calibrating. For the particular application described above, the invention is an improvement over past instruments and methods not only in cost but also in the degree to which it exercises the bridge. For example, with 35 effectively random choices (or well chosen according to (m) above) of resistance there is a high probability that all ten possible numerals (0 through 9) occur on all digits of the bridge reading. Since with most bridges each digit is functionally linked to the component dividers in the bridge the invention provides additional valuable information that helps confirm that the bridge is functioning correctly.

This is to be contrasted with the other two methods for checking bridges where typically the bridge is exercised on fewer equally spaced ratios (for example, readings near 0.1, 0.2, 0.3 . . . 1.0). There are known faults that occur in resistance bridges that will not be detected with such non-random values, and which stand a very high probability of being detected using the invention.

Traditionally, Hamon resistors have not been used for this application for three main reasons. Firstly, because they are designed to realise resistances whose values are widely separated, very few of the possible combinations fall within the useful range of the bridge. Secondly, the few resistances that fall within the useful range of a bridge are often equally spaced, for example at intervals such as 0.1, 0.2, 0.3 . . . 1.0, so the bridge is exercised only at a few related points in its range. To achieve the same accuracy as any of the other methods, many repetitions of the measurements must be made. Thirdly, in most electrical metrology, the frequencies employed for AC measurements were considered sufficiently high to impair the performance of the Hamon resistors relative to bridge techniques which are capable of accuracies of the order of a few parts in 1 000 000 000. Therefore Hamon resistances have traditionally been DC instruments only, and not considered for AC applications.

Networks of the invention may also be used to verify or calibrate a resistance measuring instrument, including resistance, conductance and audio frequency impedance bridges. They could also be used in self calibrating digital volt meters for example. A network of the invention may also be useful as a low-cost high-performance simulator for resistive sensors and so be useful in the verification of the sensor instrumentation.

The foregoing describes the invention. The invention also encompasses the combination of a network of the invention with a Hamon or other network to form a combination network. Other alterations and modifications as will be obvious to those skilled in the art are intended to be incorporated within the scope hereof as defined in the following claims.

We claim:

1. A four-terminal standard resistor providing a range of standard high accuracy four-terminal resistance values for use in electrical metrology, comprising:

a network of multiple resistances of at least two difference resistance values;

external current and voltage terminals on either side of the network, across which the range of standard resistance values may be measured in four-terminal configuration; and switching means arranged to switch four-terminal connections to and between each of the resistances in the network in different series, parallel and series-parallel configurations giving a range of four-terminal resistance values between the external current and voltage terminals greater in number than the number of said multiple resistances.

2. A resistor according to claim 1, wherein the switching means of the combining network is computer controllable.

3. A resistor according to claim 1, wherein when the network forms part of an electrical bridge, and substantially all two, eight, or ten or other numerals occur on every binary, octal, or denary or other radix digit of the bridge reading.

4. A resistor according to claim 1, wherein the number of four-terminal resistance values across the network is at least double the number of said multiple resistances.

5. A resistor according to claim 1, wherein the multiple resistances comprise a first two resistances each having a first resistance value and a second two resistances each having a second resistance value.

6. A resistor according to claim 5, wherein the multiple resistances are arranged in a star, ring, or ladder configuration to form the network.

7. The resistor of claim 6, wherein the combining network is switchable to provide at least twelve resistance values from the network.

8. A resistor according to claim 5, wherein the combining network is switchable to provide at least twelve resistance values from the network.

9. A resistor according to claim 5, wherein the multiple resistances are arranged in a star configuration to form the network.

10. A resistor according to claim 1, wherein the multiple resistances comprise at least four resistances all of different values.

11. A resistor according to claim 10, wherein the multiple resistances are arranged in a star configuration to form the network.

12. A resistor according to claim 10, wherein the combining network is switchable to provide at least twenty six resistance values from the network.

13. A resistor according to claim 10, wherein the combining network is switchable to provide thirty five resistance values from the network.

14. A resistor according to claim 10, wherein the multiple resistances are arranged in a star, ring, or ladder configuration to form the network.

15. The resistor of claim 14, wherein the combining network is switchable to provide at least twenty six resistance values from the network.

16. The resistor of claim 14, wherein the combining network is switchable to provide thirty five resistance values from the network.

17. A resistor according to claim 1, wherein the resistance network provides resistance values which are all rational multiples of each other.

18. A four-terminal resistance network providing a range of standard high accuracy four-terminal resistance values for use in electrical metrology, comprising a network of at least four resistances of different resistance values arranged in a star configuration, external current and voltage terminals on either side of the network across which the range of standard resistance values may be measured in four-terminal configuration, and switching means arranged to switch four-terminal connections to and between each of the resistances in the network in different series, parallel and series-parallel configurations in which all of said resistances are connected by the switching means and in other such configurations in which only some of said resistances are connected by the switching means to provide a number of four-terminal resistance values across the network between the external current and voltage terminals greater than the number of said resistances.

* * * * *